United States Patent [19]

Noguchi et al.

[11] Patent Number: 5,738,916

[45] Date of Patent: Apr. 14, 1998

[54] ULTRAVIOLET-CURING COMPOSITION, PATTERN FORMING METHOD MAKING USE OF THE SAME, PRINTED-WIRING BOARD AND ITS PRODUCTION

[75] Inventors: Hiromichi Noguchi, Atsugi; Hiroshi Sugitani, Machida; Yutaka Koizumi, Yokohama; Tadayoshi Inamoto, Hachioji; Kiyomi Aono, Kokubunji; Yoshie Nakata, Kawasaki, all of Japan

[73] Assignee: Canon Kabushiki Kaisha, Tokyo, Japan

[21] Appl. No.: 740,259

[22] Filed: Oct. 25, 1996

Related U.S. Application Data

[62] Division of Ser. No. 355,020, Dec. 13, 1994, abandoned.

[30] Foreign Application Priority Data

Dec. 14, 1993 [JP] Japan ................................ 5-313620

[51] Int. Cl.⁶ .................................. C08J 7/04; B44C 1/22
[52] U.S. Cl. .............................. 427/511; 522/84; 216/27; 156/656; 156/659.1
[58] Field of Search ........................ 522/100, 84, 75, 522/79; 427/511; 216/27; 156/656, 659.1

[56] References Cited

U.S. PATENT DOCUMENTS

| | | | |
|---|---|---|---|
| 4,100,047 | 7/1978 | McCarty | 522/84 |
| 4,303,924 | 12/1981 | Young, Jr. | 346/1.1 |
| 4,499,176 | 2/1985 | Curtis et al. | 522/75 |
| 4,547,394 | 10/1985 | Herz et al. | 522/84 |
| 4,839,399 | 6/1989 | Sato et al. | 522/14 |
| 4,839,400 | 6/1989 | Sato et al. | 522/14 |
| 4,978,969 | 12/1990 | Chieng | 346/1.1 |
| 5,068,257 | 11/1991 | Noguchi | 522/31 |
| 5,068,258 | 11/1991 | Noguchi | 522/31 |
| 5,068,259 | 11/1991 | Noguchi | 522/31 |
| 5,068,260 | 11/1991 | Noguchi | 522/31 |
| 5,068,262 | 11/1991 | Noguchi | 522/95 |
| 5,068,263 | 11/1991 | Noguchi | 522/109 |
| 5,270,368 | 12/1993 | Lent et al. | 524/236 |

FOREIGN PATENT DOCUMENTS

| | | | |
|---|---|---|---|
| 63-235382 | 9/1988 | Japan | C09D 11/00 |
| 5-64667 | 5/1993 | Japan | C09D 11/00 |
| 5186725 | 7/1993 | Japan | C09D 11/00 |

*Primary Examiner*—Susan W. Berman
*Attorney, Agent, or Firm*—Fitzpatrick, Cella, Harper & Scinto

[57] ABSTRACT

An ultraviolet-curing composition comprising an ultraviolet-curing compound having at least one carboxyl group and at least one ultraviolet-curing unsaturated bond in its molecule, a base, water, and a polymerization initiator, and having a viscosity of 10 centipoises or below.

14 Claims, No Drawings

5,738,916

ULTRAVIOLET-CURING COMPOSITION, PATTERN FORMING METHOD MAKING USE OF THE SAME, PRINTED-WIRING BOARD AND ITS PRODUCTION

This application is a division of application Ser. No. 08/355,020 filed Dec. 13, 1994, now abandoned.

BACKGROUND OF THE INVENTION

1. Field of the Invention

This invention relates to a novel ultraviolet-curing composition, a pattern forming method making use of the composition, a printed-wiring board and a process for producing the printed-wiring board.

More particularly, this invention is concerned with printed-wiring board processing. In forming a copper printed-wiring pattern, a resist pattern for etching a copper-clad laminate is directly drawn on copper foil by ink-jet printing.

2. Related Background Art

In conventional subtractive processes used in printed-wiring board processing, wiring patterns are formed by preparing pattern films by means of a laser plotter in accordance with wiring pattern data outputted from a CAD (computer-aided design system), and etching copper foil by using a resist ink or a dry film resist.

In such conventional processes, it is necessary to first form a pattern film, and to prepare a printing plate in the case when a resist ink is used or to take the steps of lamination, exposure and development in the case when a dry film resist is used.

Such methods currently used can be said to be methods in which the digitized wiring data are returned to an analogic image forming step. Screen printing has a limit to work size because of the printing precision of the plate. The dry film process is a photographic process and, though promising a high precision, requires many steps, inevitably resulting in a reasonably high cost especially for the manufacture in small lots.

Known compositions containing an ultraviolet-polymerizable material are disclosed in, e.g., Japanese Patent Publication No. 5-64667, Japanese Patent Application Laid-open No. 63-235382, U.S. Pat. No. 4,978,969 and Japanese Patent Application Laid-open No. 5-186725.

Japanese Patent Publication No. 5-64667 discloses a non-aqueous composition containing a pigment and essentially a tri- or more-functional polyacrylate as a polymerizable material, and employing ketone or alcohol as a prime solvent.

Japanese Patent Application Laid-open No. 63-235382 discloses a composition containing an ultraviolet-curing adhesive comprised of an epoxy acrylate.

Japanese Patent Application Laid-open No. 5-186725 discloses an ink containing a photo-setting prepolymer having a monomer structure and containing two or more functional groups.

SUMMARY OF THE INVENTION

An object of the present invention is to provide, by using an ink-jet printing device, a pattern forming method, a process for producing a printed-wiring board and an ultraviolet-curing composition used therein, that can decrease the number of steps for forming copper printed wiring patterns and can achieve a cost reduction.

Another object of the present invention is to provide an ultraviolet-curing composition that enables printing on a substrate having no liquid-absorption, enables stripping of resist patterns printed, and has etching resist properties.

The above objects of the present invention can be achieved by the invention described below.

The present invention is an ultraviolet-curing composition comprising an ultraviolet-curing compound having at least one carboxyl group and at least one ultraviolet-curing unsaturated bond in its molecule, a base, water, and a polymerization initiator, and having a viscosity of 10 centipoises or below.

In another embodiment, the present invention is an ultraviolet-curing composition comprising an ultraviolet-curing compound having at least one carboxyl group and at least one ultraviolet-curing unsaturated bond in its molecule, an acrylate or methacrylate of polyethylene glycol with a molecular weight of not more than 1,000, a base, water, and a polymerization initiator, and having a viscosity of 10 centipoises or below.

In still another embodiment, the present invention is an ultraviolet-curing composition comprising an ultraviolet-curing compound having at least one carboxyl group and at least one ultraviolet-curing unsaturated bond in its molecule, an alkali-soluble resin with an acid value of not less than 50, a base, water, and a polymerization initiator, and having a viscosity of 10 centipoises or below.

In a preferred embodiment of the present invention, the ultraviolet-curing composition contains a base having a boiling point of 190° C. or below at normal pressure and further contains a coloring material.

The present invention is also a pattern forming method comprising the steps of;

patternwise imparting the ultraviolet-curing composition described above to the surface of a substrate by ink-jet printing; and drying the composition patternwise imparted, to evaporate solvent, followed by exposure to ultraviolet rays.

The present invention is also a process for producing a printed-wiring board, comprising the steps of;

patternwise imparting the ultraviolet-curing composition described above to the surface of a copper-foil laminated substrate by ink-jet printing;

drying the composition patternwise imparted, to evaporate its solvent, followed by exposure to ultraviolet rays to form an etching resist pattern; and etching the copper foil.

The process may preferably further comprise the step of removing the etching resist pattern.

The present invention is further a printed-wiring board obtained by the process described above.

DESCRIPTION OF THE PREFERRED EMBODIMENTS

The present invention provides, by using an ink-jet printing device, a technique for printing an etching resist pattern on a copper-clad laminate by a digital image recording system directly from wiping data prepared by CAD.

In the present invention, the use of the ultraviolet-curing composition described above makes it possible to obtain superior pattern forming performance, etching resist properties and post-etching strippability. In the ultraviolet-curing composition, a silicone type surface active agent and/or a thixotropic compound may be incorporated. The incorporation of these makes it possible to obtain a clearer pattern form as copper printed-wiring on the copper-clad laminate. More specifically, when this composition is ejected onto a usual brush-polished copper-clad laminate to print a resist pattern, the composition has a wetting-spreadability such that a pattern can be drawn in a given form and size without being affected by polish marks on the surface. The resist pattern formed at the same time serves as a copper foil etching resist and has a resistance to both acidic etchants and alkaline etchants, in other words, a resistance to chemical matter and an adhesion to substrates. Incorporation of a monohydric alcohol into this composition improves bubble generation and drop ejection performance in bubble jet type ink-jet printing and brings about a stabler printing suitability.

Incorporation of a silicone type surface active agent into the composition having etching resist properties enables control of wetting-spreadability when the resist pattern is printed on the copper-clad laminate, so that preferable dot forms can be obtained. The silicone type surface active agent used here may include nonionic surface active agents having an ethylene oxide chain as a hydrophilic group and a dimethyl siloxane chain as a silicone chain. These materials can be selected from those commercially available when used.

Incorporation of a thixotropic compound into the composition of the present invention also enables control of wetting-spreadability, so that preferable dot forms can be obtained. This thixotropic compound is a generic term of compounds having the action to thicken, agglomerate or gelatinize compositions containing water, as typified by dibenzylidene sorbitol, alginic acid and chitosan. When the composition containing such a compound is used, droplets ejected and impacted onto the substrate can quickly thicken as a result of slight evaporation of water or as a result of evaporation of mediums accelerated by previously heating the substrate, so that unwanted spread of dots can be prevented to make it easy to control pattern form and size.

Ultraviolet-curing Composition

The ultraviolet-curing compound having at least one carboxyl group and at least one ultraviolet-curing unsaturated bond in its molecule, used in the ultraviolet-curing composition of the present invention includes the following.

(1) Reaction products of a dibasic acid anhydride with an acrylic ester or methacrylic ester containing a hydroxyl group. Typical compounds thereof are reaction products of succinic anhydride, orthophthalic anhydride, maleic anhydride or the like with 2-hydroxyethyl methacrylate or 3-chloro-2-hydroxypropyl methacrylate.

(2) Compounds obtained by reacting a secondary hydroxyl group of an acrylic ester of epoxy resin with a dibasic acid anhydride. Typical compounds thereof are compounds obtained by reacting a bisphenol type epoxy resin EPIKOTE 828 or EPIKOTE 1001 (trade names; available from Yuka Shell Epoxy K.K.), a polyhydric alcohol aliphatic epoxy resin DENACOL (trade name; available from Nagase Chemicals, Ltd.) as exemplified by 1,4-butanediol diglycidyl ether, trimethylolpropane diglycidyl ether or pentaerythritol diglycidyl ether and Celloxide (trade name, available from Daicel Chemicals, Ltd.) which is a cyclic epoxy resin with an acrylic ester, and thereafter reacting hydroxyl groups remaining or newly produced, with succinic anhydride or maleic anhydride.

3) Compounds obtained by reacting a polyhydric alcohol ester of acrylic acid or methacrylic acid with a dibasic acid anhydride. Typical compounds thereof are compounds obtained by reacting a glycol or polyethylene glycol ester of acrylic acid with succinic anhydride or maleic anhydride. The glycol or polyethylene glycol used here may preferably be those having a molecular weight of not more than 600.

(4) Water-soluble urethane acrylates and methacrylates having a carboxyl group side chain in the molecular chain. Syntheses of oligomers as ultraviolet-curing resins are known in the art. Oligomer compounds having the carboxyl group side chain can be synthesized by utilizing in the course of the oligomer synthesis reaction a polyhydric acid as typified by trimellitic anhydride or a compound having two hydroxyl groups and one carboxyl group in the molecule as typified by dimethylolpropionic acid.

Base

The compounds exemplified in the foregoing are neutralized by a base to form compounds readily soluble in water. The base used can be exemplified by ammonia, methylamine, ethylamine, dimethylamine, diethylamine n-butylamine, di-n-butylamine, trimethylamine, ethylenediamine, diethylenetriamine, triethylenetetramine, tetraethylenepentamine, propylenediamine, ethanolamine, hexylamine, laurylamine, diethanolamine, triethanolamine, morpholine, piperidine, propylamine, isopropylamine, isobutylamine, NaOH, LiOH and KOH. Here, as the base used, organic bases are preferred in order to endow the ultraviolet-curing composition with the chemical resistance to etchants or etching solutions and to make the ultraviolet-curing composition strippable from the substrate by a strong alkali. Among these, bases having a high volatility are particularly preferred, and bases having a boiling point of 190° C. or below at normal pressure are preferred.

Polymerization Initiator

As the polymerization initiator for ultraviolet polymerization, it is possible to use known substances soluble in polar solvents. Examples thereof are benzoin ethers such as benzoin methyl ether, benzoin ethyl ether and benzoin isopropyl ether, acryloxime esters, dialkoxyacetophenones such as p-dimethylaminoacetophenone and 2,2-diethoxyacetophenone, chlorinated acetophenones such as 2-chlorothioxanthone, benzyl ketals such as benzyl dimethyl ketal; 1-hydroxycyclohexyl phenyl ketone, 2-hydroxy-2-methyl-1-phenyl-1-one, 1-[4-(2-hydroxyethyl)phenyl]-2-hydroxy-2-methyl-1-propane-1-one, benzophenone, and mixtures of these with hydrogen-donative aromatic amines. Of these polymerization initiators, those having a hydroxyl group in the molecule are preferred because of their high solubility in liquid mediums.

Medium

The ultraviolet-curing composition of the present invention makes use of water as a main medium.

As mediums other than water, any of water-soluble organic solvents having a high wettability, capable of being evaporated with difficulty and having a good hydrophilicity can be added. It is possible to use ethylene glycol, diethylene glycol, triethylene glycol, tripropylene glycol, glycerol, 1,2, 4-butanetriol, 1,2,6-hexanetriol, 1,2,5-pentanetriol, 1,2-butanediol, 1,3-butanediol, 1,4-butanediol, dimethylsulfoxide, diacetone alcohol, glycerol monoallyl ether, propylene glycol, butylene glycol, polyethylene glycol 300, thiodiglycol, N-methyl-2-pyrrolidone, 2-pyrrolidone, γ-butyrolactone, 1,3-dimethyl-2-imidazolidinone, sulforane, trimethylol propane, neopentyl glycol, ethylene glycol monomethyl ether, ethylene glycol monoethyl ether, ethylene glycol monoisopropyl ether, ethylene glycol monoallyl ether, diethylene glycol monomethyl ether, diethylene glycol monoethyl ether, triethylene glycol monomethyl ether, propylene glycol monoethyl ether, dipropylene glycol monomethyl ether, β-dihydroxyethylurea, urea, acetonyl acetone, pentaerythritol, 1,4-cyclohexanediol, hexylene glycol, ethylene glycol monopropyl ether, ethylene glycol monobutyl ether, ethylene glycol monoisobutyl ether, ethylene glycol monophenyl ether, diethylene glycol diethyl ether, diethylene glycol monobutyl ether, diethylene glycol monoisobutyl ether, triethylene glycol monobutyl ether, triethylene glycol dimethyl ether, triethylene glycol diethyl ether, tetraethylene glycol dimethyl ether, tetraethylene glycol diethyl ether, propylene glycol monobutyl ether, dipropylene glycol monomethyl ether, dipropylene glycol monopropyl ether, dipropylene glycol monobutyl ether, tripropylene glycol monomethyl ether, glycerol monoacetate, glycerol diacetate, glycerol triacetate, ethylene glycol monomethyl ether acetate, diethylene glycol monomethyl ether acetate, cyclohexanol, 1,2-cyclohexanediol, 1-butanol, 3-methyl-1,5-pentanediol, 3-hexene-2,5-diol, 2,3-butanediol, 1,5-pentanediol, 2,4-pentanediol, 2,5-hexanediol, ethanol, n-propanol, 2-propanol, 1-methoxy-2-propanol, furfuryl alcohol, and tetrahydrofurfuryl alcohol. The water soluble organic solvents may preferably be used in a total amount of from 5 to 40% by weight based on the weight of the whole composition.

To the ultraviolet-curing composition of the present invention, an acrylic ester or methacrylic ester of polyethylene glycol having a molecular weight of not more than 1,000 may be added. This is effective for dissolving or stripping resist patterns after etching. Examples of such an ester are diacrylates of polyethylene glycol, such as NK Ester A-200, NK Ester A-400 and NK Ester A-600, and dimethacrylates of polyethylene glycol, such as NK Ester 1-G, NK Ester 2-G, NK Ester 3-G, NK Ester 4-G, NK Ester 9-G, NK Ester 14-G and NK Ester 23-G (products all available from Shin-Nakamura Chemical Co., Ltd.).

Alkali-soluble Resin Having Acid Value

To the ultraviolet-curing composition of the present invention, an alkali-soluble resin with an acid value of not less than 50 may be added. This is also effective for dissolving or stripping resist patterns after etching. Such a compound includes copolymers of acrylic acid, methacrylic acid or maleic acid with other alkyl acrylate monomer or styrene, and can be selected from various materials commercially available for use in binders for water-based coating, dispersants for pigments, etc.

These polymeric compounds having an acid value of not less than 50 contribute an improvement in the dissolving or stripping performance required for strongly alkaline stripping solutions used after etching. Such a polymeric compound may preferably have an acid value of from 70 to 140.

Other Polymerizable Compounds

In addition to such an ultraviolet-curing resin having an acid value as described above, it is possible to add to the ultraviolet-curing composition of the present invention a monofunctional monomer, what is called reactive diluent and a polyfunctional and highly cross-linkable oligomer under appropriate selection, in order to decrease the viscosity of the composition, to improve the compatibility or to control the reaction rate.

Coloring Material

In the ultraviolet-curing composition of the present invention, a coloring material may be dissolved or dispersed in order to make printed patterns visible. It may be selected from high-purity dyes having been hitherto developed as dyes for ink-jet recording, including acid dyes, direct dyes, basic dyes, oil-soluble dyes, disperse dyes, reactive dyes and food dyes. Examples thereof are, when printed patterns are colored in blue as commonly done in resist inks, C.I. Direct Blue 86, C.I. Direct Blue 199, C.I. Acid Blue 9 and C.I. Oil Blue 9.

The respective components in the ultraviolet-curing composition of the present invention should be mixed in a proportion falling under the following range, where the viscosity of ink must be controlled to be 10 centipoises or below.

The ultraviolet-curing resin and the polymerization initiator should be in a weight ratio of from 100:3 to 100:10. The base should be in a minimum amount necessary for completely dissolving the ultraviolet-curing resin in water. This may be added after calculation of the amount approximately corresponding to the acid value of such resin. The acrylic ester or methacrylic ester of polyethylene glycol having a molecular weight of not more than 1,000 that is optionally added may be used in the range of from 10:100 to 50:100 as its ratio to the main component ultraviolet-curing resin having an acid value. The alkali-soluble resin having an acid value of not less than 50 that is optionally added may be used in the range of from 10:100 to 30:100 with respect to the main component ultraviolet-curing resin having an acid value. Regarding the acrylic ester or methacrylic ester of polyethylene glycol having a molecular weight of not more than 1,000 and the alkali-soluble resin having an acid value of not less than 50, both components may be added at the same time and should be used so as to be in the range of from 10:100 to 50:100 in total weight as their ratio to the main component ultraviolet-curing resin having an acid value. The solid contents are determined so that the viscosity is 10 centipoises or below as a whole. The solvent other than water may be used in the range of from 5 to 40% by weight.

The pattern forming method and the process for producing a printed-wiring board according to the present invention are carried out in the following way.

A copper-clad laminate for the printed-wiring board is surface-conditioned as usual (e.g., by chemical polishing, brush polishing or sandblasting), followed by drying. Using the substrate thus obtained, the ultraviolet-curing composition of the present invention is charged in an ink-jet recording device to make a print in a wiring pattern. The substrate on which the pattern has been printed is dried to remove the medium, and subsequently the coating patternwise formed of the ultraviolet-curing composition is cured using an ultraviolet exposure device. The substrate on which a resist pattern has been thus formed is etched using a copper etching solution of a ferric chloride type, cupric chloride type or ammonium persulfate type. From the substrate having been thus etched, the resist is stripped using an aqueous solution of sodium hydroxide or an organic alkali. The procedure having these steps is an ordinary process currently used in the manufacture of printed-wiring boards.

The present invention will be described below in greater detail by giving Examples. In the following, "part(s)" refers to "part(s)" by weight.

EXAMPLE 1

An ultraviolet-curing composition was prepared using the following components.

| | |
|---|---|
| Ultraviolet-curing resin (a reaction product of succinic anhydride with 2-hydroxyethyl acrylate) | 10 parts |
| Ammonia | 1.0 part |
| IRGACURE 2959*1 (trade name; available from Ciba-Geigy Corp.) | 0.5 part |
| Water | 90 parts |
| C.I. Direct Blue 86 | 0.2 part. |

*1: 1-[4-(2-hydroxyethyl)-phenyl]-2-hydroxy-2-methyl-1-propan-1-one.

This composition was charged in an ink-jet printer of a system in which the number of nozzles is 48, resolution in the directions of primary and secondary scanning is 600 dpi, droplet volume is 35 pl and a piezoelectric element with a drive frequency of 4 kHz is used as an ejection energy generating element. Using this printer, an etching resist pattern was printed on a copper-clad laminate for a printed-wiring board having been brush-polished (for public use; one-side copper foil thickness: 35 μm; substrate thickness: 1.2 mm). The wiring pattern was printed in accordance with printing data prepared from wiring pattern data previously made up. After the printing, the resulting copper-clad laminate was heated in a 80° C. oven for 15 minutes to remove the solvent, and then passed through an ultraviolet-curing device to effect curing. Lamp intensity was 100 mW/cm² (at wavelength around 365 nm), pass speed was 2 m/min, and exposure time was about 13 seconds.

The wiring pattern thus printed had a wiring width of about 155 μm and a through-hole pad outer diameter of 1.2 mm. After the substrate was cured, etching was carried out using a ferric chloride type etching solution and a copper chloride type etching solution each. The etching was carried out at 50° C. for 4 minutes by spraying. After the etching, the resulting substrate was washed with water and wiring width was measured to obtain the results that the width of copper wiring was, on the average, as follows:

In the case of the ferric chloride type etching solution; wiring with: 120 μm, pad diameter: 0.96 mm; and in the case of the copper chloride type etching solution, wiring with: 125 μm, pad diameter: 0.97 mm.

After the measurement, the resist films were stripped using a 40° C. spray type stripping device making use of a 1% NaOH solution. It was possible to complete the stripping without causing problems such as resist residues.

EXAMPLE 2

An ultraviolet-curing composition was prepared using the following components.

| | |
|---|---|
| Ultraviolet-curing resin (a reaction product of orthophthalic anhydride with 2-hydroxyethyl acrylate) | 10 parts |
| Ammonia | 1.1 part |
| IRGACURE 651 (trade name; available from Ciba-Geigy Corp.; benzyl dimethyl ketal) | 0.5 part |
| Water | 90 parts |
| C.I. Direct Blue 86 | 0.2 part. |

EXAMPLE 3

An ultraviolet-curing composition was prepared using the following components.

| | |
|---|---|
| Ultraviolet-curing resin (a reaction product of orthophthalic anhydride with 2-hydroxyethyl acrylate) | 15 parts |
| NK Ester A-600 (trade name; available from Shin-Nakamura Chemical Co., Ltd.; polyethylene glycol #600 diacrylate) | 5 parts |
| Ammonia | 1.0 part |
| IRGACURE 2959 | 0.5 part |
| Water | 70 parts |
| N-methylpyrrolidone | 15 parts |
| C.I. Direct Blue 86 | 0.2 part. |

EXAMPLE 4

An ultraviolet-curing composition was prepared using the following components.

| | |
|---|---|
| Ultraviolet-curing resin (a reaction product of orthophthalic anhydride with 2-hydroxyethyl acrylate) | 15 parts |
| NK Ester A-600 | 5 parts |
| Styrene-acrylic acid copolymer (Acid value: 100; Molecular weight: 12,500) | 3 parts |
| Dimethylamine | 1.5 parts |
| IRGACURE 2959 | 0.5 part |
| Water | 80 parts |
| Ethylene glycol monomethyl ether | 10 parts |
| C.I. Direct Blue 86 | 0.2 part. |

EXAMPLE 5

An ultraviolet-curing composition was prepared using the following components.

| | |
|---|---|
| Ultraviolet-curing resin (a reaction product of succinic anhydride with 2-hydroxyethyl acrylate) | 15 parts |
| Bifunctional polyether type urethane acrylate (Acid value: 60; Molecular weight: 1,600) | 10 parts |
| Benzophenone | 0.6 part |
| Para-dimethylaminoacetophenone | 0.2 part |
| Monoethanolamine | 2.0 parts |
| Water | 75 parts |
| N-methylpyrrolidone | 5 parts |
| C.I. Direct Blue 86 | 0.2 part. |

Using the foregoing compositions of Examples 2 to 5, patterns were formed in the same manner as in Example 1 and etching was tested similarly. As a result, like Example 1, it was possible to well carry out etching without causing difficulties such as resist separation, and also to strip the resists without any problems.

EXAMPLE 6

An ultraviolet-curing composition was prepared using the following components.

| | |
|---|---|
| Ultraviolet-curing resin (an epoxy acrylate resin having an acid value, obtained by reacting RIPOXY VR-60 (trade name, available from Showa Highpolymer Co., Ltd.) with succinic anhydride) | 20 parts |
| Ultraviolet-curing resin (a reaction product of succinic anhydride with 2-hydroxyethyl acrylate) | 5 parts |
| N-vinylpyrrolidone | 5 parts |

-continued

| | |
|---|---|
| Benzophenone | 0.6 part |
| Para-dimethylaminoacetophenone | 0.2 part |
| Ammonia | 1.1 parts |
| Water | 75 parts |
| Isopropyl alcohol | 5 parts |
| C.I. Direct Blue 86 | 0.2 part. |

This composition was charged in an ink-jet printer of a bubble jet system in which the number of nozzles is 128, resolution in the directions of primary and secondary scanning is 600 dpi, droplet volume is 35 pl and drive frequency is 4 kHz. Subsequently, patterns were formed in the same manner as in Example 1 and etching was tested similarly. As a result, good resist properties and strippability were shown.

As described above, the present invention can provide an ultraviolet-curing composition having superior etching resist properties and post-etching strippability.

Imparting such an ultraviolet-curing composition to the surface of a substrate by ink-jet printing can provide a printed-wiring board through reduced number of steps than those in conventional methods and also with a cost reduction.

What is claimed is:

1. A process for producing a printed-wiring board, comprising the steps of:

patternwise imparting an ultraviolet-curing aqueous composition comprising:
   (a) an ultraviolet-curing compound having at least one carboxyl group and at least one ultraviolet-curing unsaturated bond in its molecule, said compound being a reaction product of a dibasic acid anhydride with a (meth)acrylate compound,
   (b) a base selected from the group consisting of ammonia, alkylamines, alkanolamines, alkylene polyamines, morpholine, piperidine, NaOH, LiOH and KOH, and
   (c) a polymerization initiator, and having a viscosity of 10 centipoises or less, to the surface of a copper-foil laminated substrate by ink-jet printing;

drying the composition patternwise imparted, to evaporate its aqueous carrier, followed by exposure to ultraviolet rays to form an etching resist pattern;

etching the copper foil; and removing the etching resist pattern.

2. The process for producing a printed-wiring board according to claim 1, wherein said base has a boiling point of 190° C. or below at normal pressure.

3. The process for producing a printed-wiring board according to claim 1, wherein said ultraviolet-curing aqueous composition further contains a coloring material.

4. A process for producing a printed-wiring board, comprising the steps of:

patternwise imparting an ultraviolet-curing aqueous composition comprising:
   (a) an ultraviolet-curing compound having at least one carboxyl group and at least one ultraviolet-curing unsaturated bond in its molecule, said compound being a reaction product of a dibasic acid anhydride with a (meth)acrylate compound,
   (b) a base selected from the group consisting of ammonia, alkylamines, alkanolamines, alkylene polyamines, morpholine, piperidine, NaOH, LiOH and KOH,
   (c) a polymerization initiator, and
   (d) an acrylate or methacrylate of polyethylene glycol with a molecular weight of not more than 1,000, and having a viscosity of 10 centipoises or less, to the surface of a copper-foil laminated substrate by ink-jet printing;

drying the composition patternwise imparted, to evaporate its aqueous carrier, followed by exposure to ultraviolet rays to form an etching resist pattern; and etching the copper foil; and removing the etching resist pattern.

5. The process for producing a printed-wiring board according to claim 4, wherein said base has a boiling point of 190° C. or below at normal pressure.

6. The process for producing a printed-wiring board according to claim 4, wherein said ultraviolet-curing aqueous composition further contains a coloring material.

7. A process for producing a printed-wiring board, comprising the steps of:

patternwise imparting an ultraviolet-curing aqueous composition comprising:
   (a) an ultraviolet-curing compound having at least one carboxyl group and at least one ultraviolet-curing unsaturated bond in its molecule, said compound being a reaction product of a dibasic acid anhydride with a (meth)acrylate compound,
   (b) a base selected from the group consisting of ammonia, alkylamines, alkanolamines, alkylene polyamines, morpholine, piperidine, NaOH, LiOH and KOH,
   (c) a polymerization initiator, and
   (d) an alkali soluble resin with an acid value of not less than 50, and having a viscosity of 10 centipoises or less, to the surface of a copper-foil laminated substrate by ink-jet printing;

drying the composition patternwise imparted, to evaporate its aqueous carrier, followed by exposure to ultraviolet rays to form an etching resist pattern;

etching the copper foil; and removing the etching resist pattern.

8. The process for producing a printed-wiring board according to claim 7, wherein said base has a boiling point of 190° C. or below at normal pressure.

9. The process for producing a printed-wiring board according to claim 7, wherein said ultraviolet-curing aqueous composition further contains a coloring material.

10. The process according to any one of claims 1, 4 or 7 wherein said aqueous composition comprises at least one of a silicone surface active agent and a thixotropic compound.

11. The process according to any one of claims 1, 4 or 7 wherein said base is ammonia.

12. The process according to any one of claims 1, 4 or 7 wherein said base is an organic amine selected from the group consisting of alkylamines, alkanolamines, alkylene polyamines, morpholine, and piperidine.

13. The process according to any one of claims 1, 4 or 7, wherein said ink-jet printing is of a bubble jet system.

14. A printed-wiring board obtained by the process according to any one of claims 1, 4 or 7.

* * * * *